(12) United States Patent
You

(10) Patent No.: US 8,193,700 B2
(45) Date of Patent: Jun. 5, 2012

(54) ORGANIC LIGHT EMITTING DEVICE AND MANUFACTURING METHOD THEREOF

(75) Inventor: Chun-Gi You, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 171 days.

(21) Appl. No.: 12/535,635

(22) Filed: Aug. 4, 2009

(65) Prior Publication Data

US 2010/0156281 A1    Jun. 24, 2010

(30) Foreign Application Priority Data

Dec. 24, 2008   (KR) .................... 10-2008-0133830

(51) Int. Cl.
*H01J 1/62* (2006.01)
*H01J 63/04* (2006.01)
*H01L 21/00* (2006.01)

(52) U.S. Cl. ........ 313/504; 313/483; 313/498; 313/500; 313/506; 313/505; 438/29

(58) Field of Classification Search .................... None
See application file for complete search history.

(56) References Cited

U.S. PATENT DOCUMENTS

| 6,853,421 B2 * | 2/2005 | Sakamoto et al. | 349/114 |
| 7,548,019 B2 * | 6/2009 | Omura et al. | 313/506 |
| 7,586,254 B2 * | 9/2009 | Kwak et al. | 313/504 |
| 2006/0192220 A1 * | 8/2006 | Nishikawa et al. | 257/98 |
| 2007/0002222 A1 * | 1/2007 | Lim et al. | 349/114 |
| 2007/0102737 A1 * | 5/2007 | Kashiwabara et al. | 257/291 |
| 2007/0291209 A1 * | 12/2007 | Tanaka et al. | 349/129 |
| 2009/0267495 A1 * | 10/2009 | Jung et al. | 313/504 |

FOREIGN PATENT DOCUMENTS

| JP | 2003-050389 | 2/2003 |
| KR | 1994-0012658 | 6/1994 |
| KR | 10-0232679 | 9/1999 |
| KR | 2002-0089008 | 11/2002 |
| KR | 2003-0064975 | 8/2003 |
| KR | 10-498087 | 6/2005 |
| KR | 2005-0068241 | 7/2005 |
| KR | 2006-0046476 | 5/2006 |
| KR | 2006-0079225 | 7/2006 |
| KR | 2006-0095494 | 8/2006 |
| KR | 2007-0001381 | 1/2007 |
| KR | 2007-0002918 | 1/2007 |
| KR | 2007-0119491 | 12/2007 |
| KR | 2007-0121421 | 12/2007 |

* cited by examiner

*Primary Examiner* — Natalie Walford
(74) *Attorney, Agent, or Firm* — Innovation Counsel LLP

(57) ABSTRACT

An organic light emitting device including a pixel area displaying images and a peripheral area that is a peripheral portion of the pixel area is disclosed. A manufacturing method of an organic light emitting device includes: forming a switching element of the pixel area; forming a peripheral signal line in the peripheral area; forming a passivation layer on the switching element and the peripheral signal line; forming an overcoat and a remaining layer on the passivation layer; forming a transflective member and a thickness control layer on the overcoat; removing the remaining layer; forming a pixel electrode on the transflective member and the thickness control layer; forming an organic light emitting member on the pixel electrode; and forming a common electrode on the organic light emitting member. The remaining layer is maintained in the peripheral area such that the etchant is prevented from penetrating into the peripheral signal line, thereby preventing the corrosion of the peripheral signal line.

7 Claims, 7 Drawing Sheets

ORGANIC LIGHT EMITTING DEVICE AND MANUFACTURING METHOD THEREOF

CROSS-REFERENCE TO RELATED APPLICATION

This application claims priority to and the benefit of Korean Patent Application No. 10-2008-0133830 filed in the Korean Intellectual Property Office on Dec. 24, 2008, the entire contents of which are incorporated herein by reference.

BACKGROUND OF THE INVENTION (a) Field of the Invention

The present invention relates to an organic light emitting device and a manufacturing method thereof.

(b) Description of the Related Art

The organic light emitting device includes a plurality of pixels, and each pixel includes an organic light emitting element and a plurality of thin film transistors for driving them.

The organic light emitting element includes an anode and a cathode as two electrodes and an organic light emitting member disposed therebetween, and the organic light emitting member emits light of three primary colors such as red, green, and blue, or white. Materials used vary according to the colors that the organic light emitting member emits, and a method of emitting white light, in which light emitting materials that emit red, green, and blue are stacked so that the synthesized light becomes white, is mainly used.

Moreover, in the case where the organic light emitting member emits white light, a color filter may be added to obtain light of a desired color.

The above information disclosed in this Background section is only for enhancement of understanding of the background of the invention and therefore it may contain information that does not form the prior art that is already known to a person of ordinary skill in the art.

SUMMARY OF THE INVENTION

The present invention prevents the corrosion of peripheral signal lines.

According to a preferred embodiment of the present invention, the organic light emitting device includes: a substrate; a switching element formed on the substrate; a passivation layer formed on the switching element; an overcoat formed on the passivation layer; a transflective member formed on the overcoat; a pixel electrode formed on the transflective member; an organic light emitting member formed on the pixel electrode; and a common electrode formed on the organic light emitting member, wherein the height of a portion disposed between the transflective members is lower than a portion overlapping the transflective member among the overcoat.

It is preferable that the transflective member has a dual-layer structure, including a lower layer made of indium tin oxide (ITO) or indium zinc oxide (IZO) and an upper layer made of silicon oxide.

A plurality of color filters formed between the passivation layer and the overcoat may be further included, and the color filters may include a red color filter, a green color filter, and a blue color filter.

A thickness control layer between the transflective member of the position corresponding to the green color filter and the pixel electrode may be further included.

The thickness control layer may include ITO or IZO.

The common electrode may include silver or aluminum, and the pixel electrode may include ITO or IZO.

It is preferable that the overcoat includes an organic material.

It is preferable that the pixel electrode is connected to the switching element through a contact hole formed in the overcoat and the passivation layer.

According to another preferred embodiment of the present invention, the organic light emitting device includes: a plurality of color filters and an overcoat sequentially formed on the substrate; a transflective member formed on the overcoat and including a lower layer made of ITO or IZO, and an upper layer made of silicon oxide; a thickness control layer formed on the transflective member at a position corresponding to the blue color filter of the color filters, and including ITO or IZO; a pixel electrode formed on the transflective member and the thickness control layer, and including ITO or IZO; an organic light emitting member formed on the pixel electrode; and a common electrode formed on the organic light emitting member and made of a reflective material, wherein the height of a portion disposed between the transflective members is lower than a portion overlapping the transflective member among the overcoat.

A method for manufacturing an organic light emitting device including a pixel area displaying images and a peripheral area that is a peripheral portion of the pixel area includes: forming a switching element of the pixel area, and a peripheral signal line of the peripheral area; forming a passivation layer on the switching element and the peripheral signal line; forming an overcoat and a remaining layer on the passivation layer; forming a transflective member and a thickness control layer on the overcoat; removing the remaining layer; forming a pixel electrode on the transflective member and the thickness control layer; forming an organic light emitting member on the pixel electrode; and forming a common electrode on the organic light emitting member.

The overcoat may be formed in the pixel area, and the remaining layer may be formed with a lesser thickness than the overcoat in the peripheral area.

It is preferable that the remaining layer is formed through partial exposure.

It is preferable that the peripheral signal line includes a fan-out portion and a pad portion that is an end of the fan-out portion, and that the remaining layer is formed in the peripheral area corresponding to the fan-out portion.

It is preferable that a first contact hole is simultaneously formed in the overcoat when forming the remaining layer.

It is preferable that a second contact hole exposing the switching element in the passivation layer at a position corresponding to the first contact hole is formed between the forming of the thickness control layer and the removing of the remaining layer.

It is preferable that the thickness of the portion among the overcoat disposed on the region between the transflective members is reduced in the removing of the remaining layer.

According to a preferred embodiment of the present invention, the remaining layer is maintained in the peripheral area through partial exposure such that the etchant is prevented from penetrating into the peripheral signal line, thereby preventing the corrosion of the peripheral signal line.

DETAILED DESCRIPTION OF THE EMBODIMENTS

Figure 1:
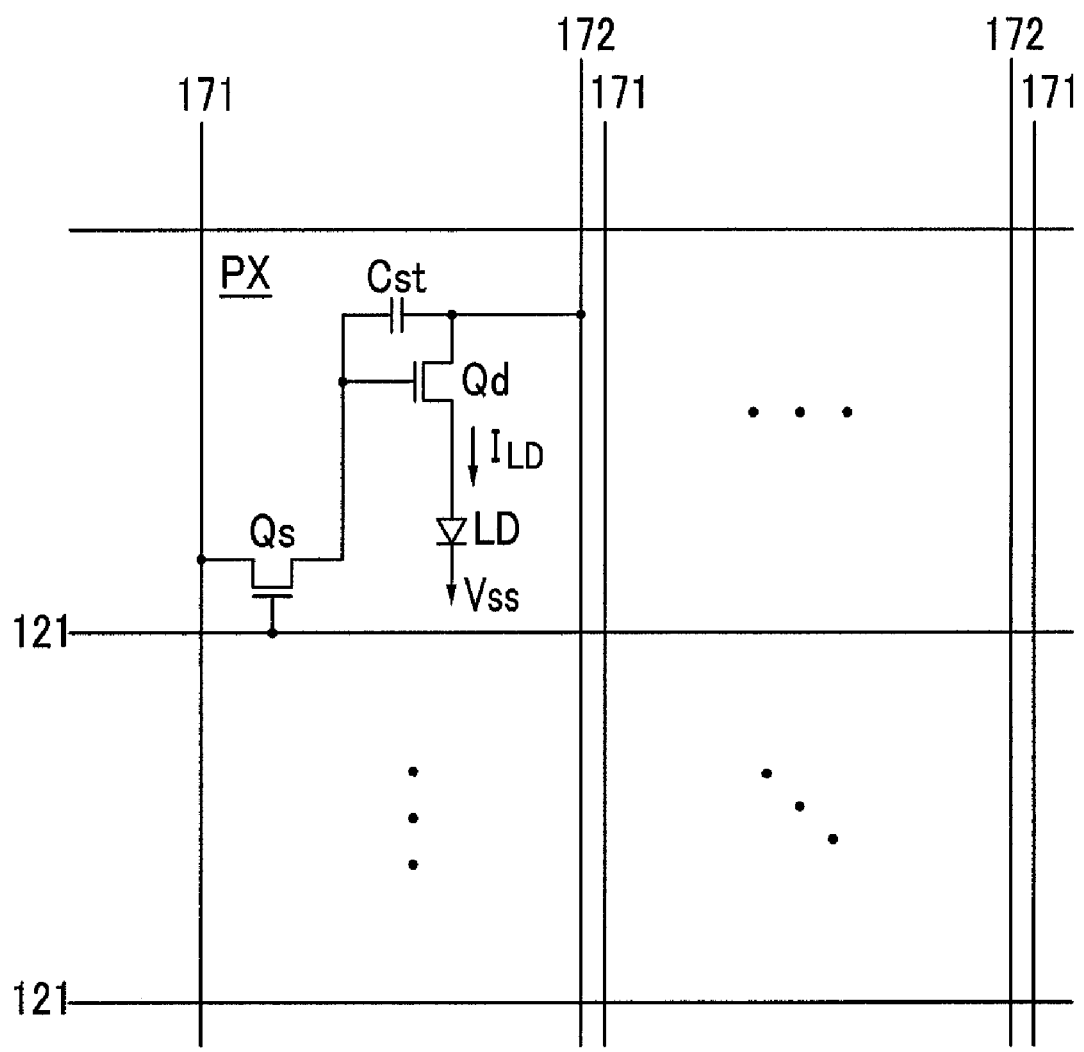
FIG. 1 is an equivalent circuit diagram of an organic light emitting device according to an embodiment of the present invention.

The present invention will be described more fully hereinafter with reference to the accompanying drawings, in which embodiments of the invention are shown. As those skilled in the art would realize, the described embodiments may be modified, added to, or substituted for in various different ways, all without departing from the spirit or scope of the present invention.

In the drawings, the thickness of layers, films, panels, regions, etc., are exaggerated for clarity. In the drawings, the same or similar elements are denoted by the same or similar reference numerals even though they are depicted in different figures. It will be understood that when an element such as a layer, film, region, or substrate is referred to as being "on" another element, it can be directly on the other element or intervening elements may also be present. In contrast, when an element is referred to as being "directly on" another element, there are no intervening elements present.

FIG. 1 is an equivalent circuit diagram of an organic light emitting device according to a preferred embodiment of the present invention.

Referring to FIG. 1, an organic light emitting device includes a plurality of signal lines 121, 171, and 172, and a plurality of pixels PX connected thereto and arranged substantially in a matrix.

The signal lines include a plurality of gate lines 121 for transmitting gate signals or scanning signals, a plurality of data lines 171 for transmitting data signals, and a plurality of driving voltage lines 172 for transmitting a driving voltage. The gate lines 121 extend substantially in a row direction and substantially parallel to each other, and the data lines 171 extend substantially in a column direction and substantially parallel to each other. The driving voltage lines 172 extend substantially in a column direction and substantially parallel to each other, however they may extend in the row direction or the column direction, or in a mesh shape.

Each pixel PX includes a switching transistor Qs, a driving transistor Qd, a capacitor Cst, and an organic light emitting element LD.

The switching transistor Qs has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to a gate signal applied to the gate line 121.

The driving transistor Qd has a control terminal connected to the switching transistor Qs, an input terminal connected to the driving voltage line 172, and an output terminal connected to the organic light emitting element LD. The driving transistor Qd drives an output current ILD having a magnitude depending on the voltage between the control terminal and the output terminal thereof.

The capacitor Cst is connected between the control terminal and the input terminal of the driving transistor Qd. The capacitor Cst stores a data signal applied to the control terminal of the driving transistor Qd and maintains the data signal after the switching transistor Qs turns off.

The organic light emitting element LD as an organic light emitting diode has an anode connected to the output terminal of the driving transistor Qd and a cathode connected to a common voltage Vss. The organic light emitting element LD emits light having an intensity depending on the output current ILD of the driving transistor Qd, thereby displaying images.

The switching transistor Qs and the driving transistor Qd are n-channel field effect transistors (FETs), however at least one may be a p-channel FET. In addition, the connections among the transistors Qs and Qd, the capacitor Cst, and the organic light emitting diode LD may be modified.

If necessary, other transistors for compensating the threshold voltage of the driving transistor Qd or the organic light emitting element LD may be included as well as the switching transistor Qs and the driving transistor Qd.

Figure 2:
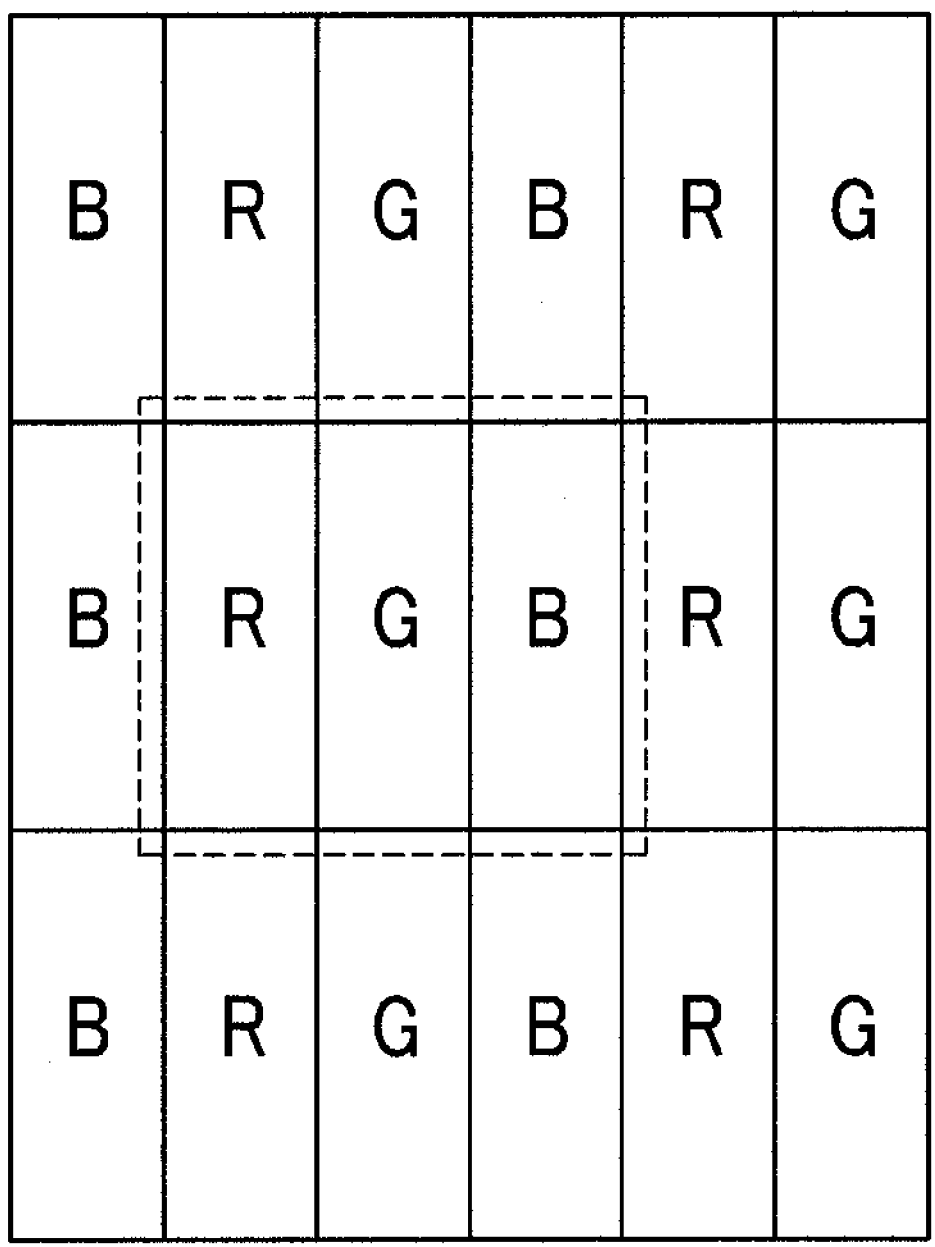
FIG. 2 is a top plan view showing an arrangement of a plurality of pixels in an organic light emitting device according to an embodiment of the present invention.

FIG. 2 is a top plan view showing an arrangement of a plurality of pixels in an organic light emitting device according to a preferred embodiment of the present invention.

Referring to FIG. 2, the organic light emitting device includes red pixels R for displaying a red color, green pixels G for displaying a green color, and blue pixels B for displaying a blue color, which are sequentially and alternately disposed.

Three pixels comprising a red pixel R, a green pixel G, and a blue pixel B form one group, and may be repeatedly arranged according to rows and/or columns. However, the arrangement of the pixels may be variously changed.

According to one embodiment of the present invention, all pixels of the organic light emitting device, that is, the red pixel R, the blue pixel B, and the green pixel G, have the same micro-cavity structure as each other. This will be described in detail below.

Figure 3:
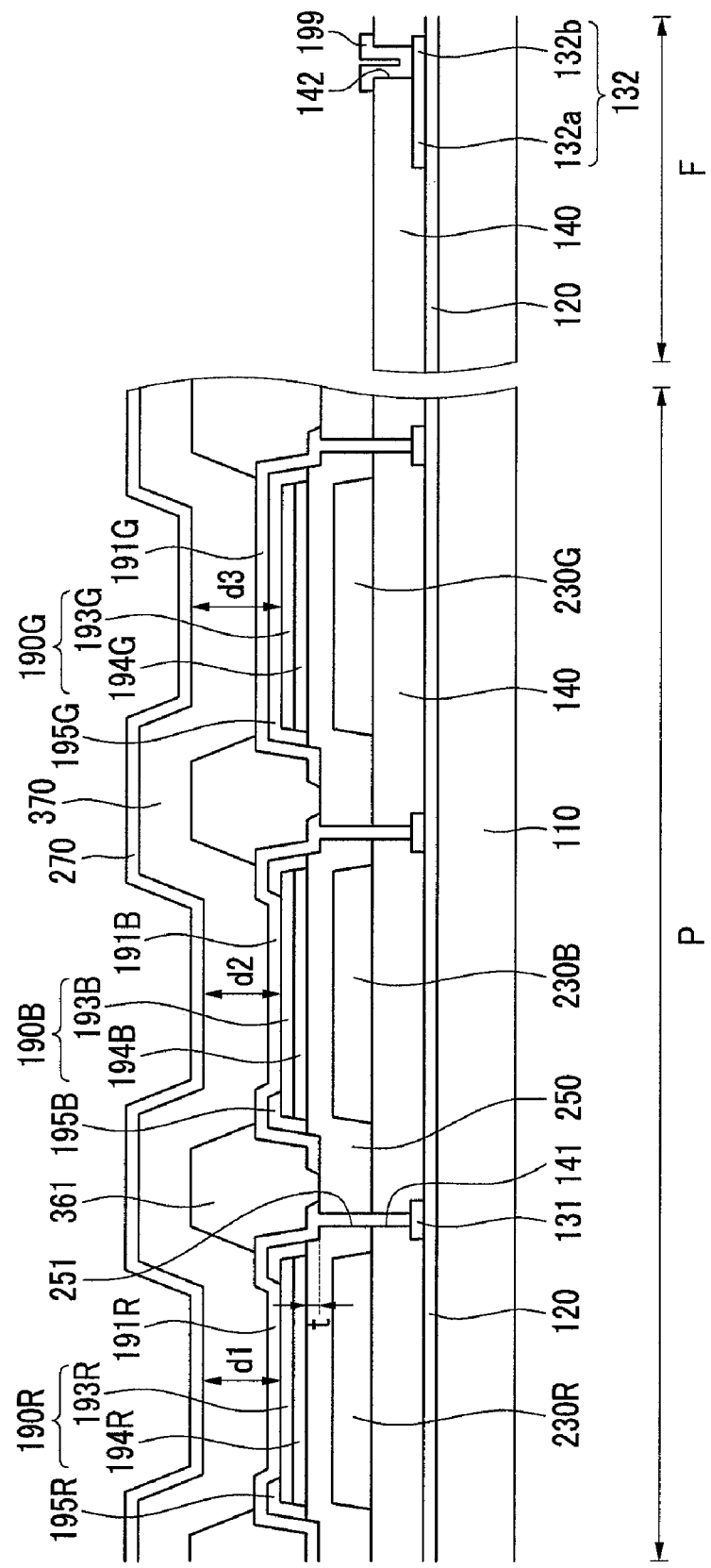
FIG. 3 is a cross-sectional view of an organic light emitting device according to an embodiment of the present invention.

FIG. 3 is a cross-sectional view of the structure of one pixel group of an organic light emitting device according to a preferred embodiment of the present invention.

An organic light emitting device includes a red pixel R, a green pixel G, and a blue pixel B. Besides a pixel of the three primary colors, red, blue and green, a pixel having other different colors may be included.

In the drawings, portions related to the red pixel R, the green pixel G, and the blue pixel B have "R", "G", and "B" respectively attached to each reference numeral with respect thereto, a pixel area is indicated by "P", and a peripheral area that is a peripheral portion of the pixel area is indicated by "F".

An interlayer insulating layer 120 made of an inorganic insulator such as silicon nitride (SiNx) or silicon oxide (SiOx) is formed on an insulation substrate 110 preferably made of transparent glass or plastic. The interlayer insulating layer 120 is formed in the pixel area and peripheral area. A switching element 131 such as a driving transistor Qd and a switching transistor Qs is formed on the interlayer insulating layer 120 of the pixel area, and a peripheral signal line 132 is formed on the interlayer insulating layer 120 of the peripheral area. A passivation layer 140 covering the switching element 131 and peripheral signal line 132 is formed on the switching element 131 and the interlayer insulating layer 120 of the pixel area, and the peripheral signal line 132 and the interlayer insulating layer 120 of the peripheral area. The passivation layer 140 is made of an inorganic insulator such as silicon nitride (SiNx) or silicon oxide (SiOx).

A red color filter 230R, a green color filter 230G, and a blue color filter 230B are formed on the passivation layer 140 of the pixel area. An overcoat 250 is formed on the color filters 230R, 230G, and 230B. The overcoat 250 may be made of an organic material and the surface thereof may be planarized. The overcoat 250 and the passivation layer 140 include a first contact hole 251 and a second contact hole 141 respectively, exposing the switching element 131.

Transflective members 190R, 190G, and 190B are formed on the overcoat 250. The transflective members 190R, 190G, and 190B are disposed on the color filters 230R, 230G, and 230B, and have substantially the same structure in the red pixel R, the blue pixel B, and the green pixel G.

In one embodiment, the transflective members 190R, 190G, and 190B have a dual-layer structure including lower layers 194R, 194G, and 194B, and upper layers 193R, 193G, and 193B. The lower transflective members 194R, 194G, and 194B are made of indium tin oxide (ITO) or indium zinc oxide (IZO), and the upper transflective members 193R, 193G, and 193B are formed of an inorganic material such as silicon oxide (SiOx).

The lower transflective layers 194R, 194G, and 194B enhance the adhesion characteristic between the upper transflective layers 193R, 193G, and 193B, and the overcoat 250 made of the organic insulator, thereby preventing the upper transflective layers 193R, 193G, and 193B from being lifted or separated.

The height of the overcoat 250 formed in the region overlapping the transflective members 190R, 190G, and 190B is higher than the height of the overcoat 250 disposed in the regions between the transflective members 190R, 190G, and 190B. According to one embodiment of the present invention, this is because the portion of the surface of the overcoat 250 that is exposed in the pixel area is removed when removing a remaining layer 351 in the peripheral area in the manufacturing method of the organic light emitting device, and will be described later. Accordingly, a step "t" is generated between the portion of the overcoat 250 overlapping the transflective members 190R, 190G, and 190B and the portion of the overcoat 250 disposed between the transflective members 190R, 190G, and 190B.

A micro-cavity structure is formed by the transflective members 190R, 190G, 190B, described below, and a common electrode 270 that is described later.

Thickness control layers 195R, 195G, and 195B are formed on the transflective members 190R, 190G, and 190B. The green thickness control layer 195G disposed on the position corresponding to the green color filter 230G completely covers the transflective member 190G, the red thickness control layer 195R disposed on the position corresponding to the red color filter 230R only covers the edge of the transflective member 190R, and the blue thickness control layer 195B disposed on the position corresponding to the blue color filter 230B only covers the edge of the transflective member 190B. The thickness control layers 195R, 195G, and 195B may be made of ITO or IZO.

A plurality of pixel electrodes 191R, 191G, and 191B are formed on the thickness control layers 195R, 195G, and 195B, and the red and blue pixel electrodes 191R and 191B respectively contact the red and blue transflective members 190R and 190B, however the green pixel electrode 191G contacts the green thickness control layer 195G.

The pixel electrodes 191R, 191G, and 191B may be made of a transparent conductor such as ITO, IZO, or ZnO. The pixel electrodes 191R, 191G, and 191B are electrically connected to the switching element 131 through the first hole 251 of the overcoat 250 and the second contact hole 141 of the passivation layer 140, and may function as an anode. Each pixel electrode 191R, 191G, and 191B has the same thickness in the red pixel R, the blue pixel B, and the green pixel G.

A plurality of insulating members 361 are formed on the boundaries between the pixel electrodes 191R, 191B, and 191G, and an organic light emitting member 370 is formed on the insulating member 361 and the pixel electrodes 191R, 191B, and 191G.

The organic light emitting member 370 may have an organic emission layer emitting light and an auxiliary layer for improving the light emitting efficiency of the organic emission layer.

The organic emission layer may include a plurality of sub-emission layers (not shown) that are formed by sequentially depositing materials uniquely emitting the light such as red, green, and blue, and may emit white light by combining the colors thereof. The sub-emission layers are not limited to being vertically deposited, and may be horizontally deposited, and they are not limited to red, green, and blue colors, but may be formed by combining various colors for emitting the white light.

The auxiliary layer may include at least one layer selected from an electron transport layer (not shown), a hole transport layer (not shown), an electron injection layer (not shown), and a hole injection layer (not shown).

A common electrode 270 is formed on the organic light emitting member 370. The common electrode 270 may be made of a reflective metal such as calcium (Ca), barium (Ba), magnesium (Mg), aluminum (Al), and/or silver (Ag), and functions as the cathode. The common electrode 270 is formed on the whole surface of the substrate 110, and forms a pair, with the pixel electrodes 191R, 191G, and 191B functioning as the anode thereby flowing the current to the organic light emitting emission layer of the organic light emitting member 370.

In one embodiment of the present invention, all of the red pixels R, the blue pixels B, and the green pixels G respectively include the transflective members 190R, 190G, and 190B, thereby forming the micro-cavity structure along with the common electrode 270.

According to a preferred embodiment of the present invention, the organic light emitting device displays images by emitting light downward of the substrate 110. The emitted light from the organic emission layer of the organic light emitting member 370 toward the substrate 110 passes through the pixel electrodes 191R, 191B, and 191G, and arrives at the transflective members 190R, 190G, and 190B. The transflective members 190R, 190G, and 190B reflect the incident light toward the common electrode 270, and the common electrode 270 again reflects the light toward the transflective members 190R, 190G, and 190B. Accordingly, the light reciprocating between the transflective members 193R, 190G, and 190B, and the common electrode 270 is subject to an optical process such as interference, and passes through the transflective members 190R, 190G, and 190B and color filter 230R, 230G, and 230B to the outside if appropriate conditions are satisfied.

In the micro-cavity structure, the light is repeatedly reflected between the reflection layer and the transflective layer that are spaced from each other by the optical length such that the light of the specific wavelength is enhanced through constructive interference. The common electrode 270 functions as the reflection layer, and the transflective members 190R, 190G, and 190B function as the transflective layer. In the micro-cavity structure, light corresponding closely to the resonance wavelength of the micro-cavity of the light emitted from the organic emission layer is enhanced through the constructive interference, while light of different wavelengths is suppressed. In the micro-cavity structure, the wavelength range of the enhanced light may be determined according to the path of the light.

That is, a condition generating the constructive interference in the micro-cavity structure is as follows in Equation 1.

$$\text{The optical length }(L) = 2nd = m\lambda \qquad \text{[Equation 1]}$$

Here, n is a refractive index of a medium, λ is the wavelength of the light passing through the medium, d is the path length for the resonance, as a resonance length, and m is a natural number such as 1, 2, and 3.

Here, the wavelength ranges of the red, the green, and the blue are different such that the optimized optical length L must be determined for each color filter for obtaining the resonance effect in the color filters. Accordingly, the interval between the transflective members 190R, 190G, and 190B and the common electrode 270 is determined to generate the constructive interference such that the high color reproducibility may be gained.

However, to produce the different optical lengths per pixel, the photolithography processes must be executed a minimum of three times to form the different thicknesses of the thickness control layers 195R, 195G, and 195B of each pixel, or emission materials must be respectively deposited per pixel by using a shadow mask to form the different thicknesses of the organic light emitting member 370 including the emission layer, such that the manufacturing process becomes complicated.

To solve these problems, the optical length L1 of at least two pixels among the red pixel R, the blue pixel B, and the green pixel G are formed the same as each other such that the processes required to form the different optical lengths per pixel may be reduced. For example, the optical lengths L1 of the red pixel R and the blue pixel B are the same as each other, and the optical lengths L1 may be determined as a value simultaneously satisfying the constructive interference condition in the wavelengths of the red region and the blue region.

The optical lengths L1 simultaneously satisfying the constructive interference condition in the wavelengths of the red region and the blue region may be represented as Equation 2 below.

$$L1 = m\lambda 1/2 = m+1 \text{ and } \lambda 2/2 \qquad \text{[Equation 2]}$$

Here, m is a natural number, for example m=1, λ1 is the wavelength of the red region, and λ2 is the wavelength of the blue region.

On the other hand, the optical length L2 of the green pixel G is different from the optical length L1 of the red pixel R and the blue pixel B. That is, the optical length L2 of the green pixel G may be shorter or longer than the optical length L1 of the red pixel R and the blue pixel B, and in an embodiment of the present invention, the optical length L2 of the green pixel G is longer than the optical length L1 of the red pixel R and the blue pixel B.

When the optical length L2 of the green pixel G is longer than the optical length L1 of the red pixel R and the blue pixel B, the optical length L2 of the green pixel G may be represented as Equation 3.

$$L2 = m+1 \text{ and } \lambda 3/2 \qquad \text{[Equation 3]}$$

Here, m is a natural number, and λ3 is the wavelength of the green region.

In contrast, when the optical length L2 of the green pixel G is shorter than the optical length L1 of the red pixel R and the blue pixel B, the optical length L2 of the green pixel G may be represented as Equation 4.

$$L2 = m\lambda 3/2 \qquad \text{[Equation 4]}$$

Here, m is a natural number, and λ3 is the wavelength of the green region.

This optical length may be controlled by the thickness control layers 195R, 195G, and 195B such that the thickness control layers 195R, 195G, and 195B are only formed in the green pixel G having the long optical length, and are removed in the red pixel R and the blue pixel B having the short optical length.

That is, the green thickness control layer 195G covers all of the green transflective member 190G such that the interval d3 between the upper portion of the green transflective member 190G and the lower portion of the common electrode 270 is increased, however the red thickness control layer 195R covers only the edge of the red transflective member 190R, and the blue thickness control layer 195B only covers the edge of the blue transflective member 190B such that the interval d1 between the upper portion of the red transflective member 190R and the lower portion of the common electrode 270, and the interval d2 between the upper portion of the blue transflective member 190B and the lower portion of the common electrode 270, are not increased.

Also, in a preferred embodiment of the present invention, the upper layer of the transflective members 190R, 190G, and 190B is not made of metal, but is made of an inorganic material such that the reflectance for the specific wavelength may be controlled to about 50% the intensity for the specific wavelength may be increased, and the band width may be reduced. Particularly, when the materials having the large differences of the refractive index are alternatively deposited, the effects thereof may be increased. Also, the upper layer of the transflective members 190R, 190G, and 190B is made of the inorganic material such that the reliability of the etch process and the reliability of the uniformity of the thin film may be increased.

Next, the manufacturing method of the organic light emitting device according to an embodiment of the present invention will be described with reference to FIG. 4 to FIG. 7.

Figure 4:
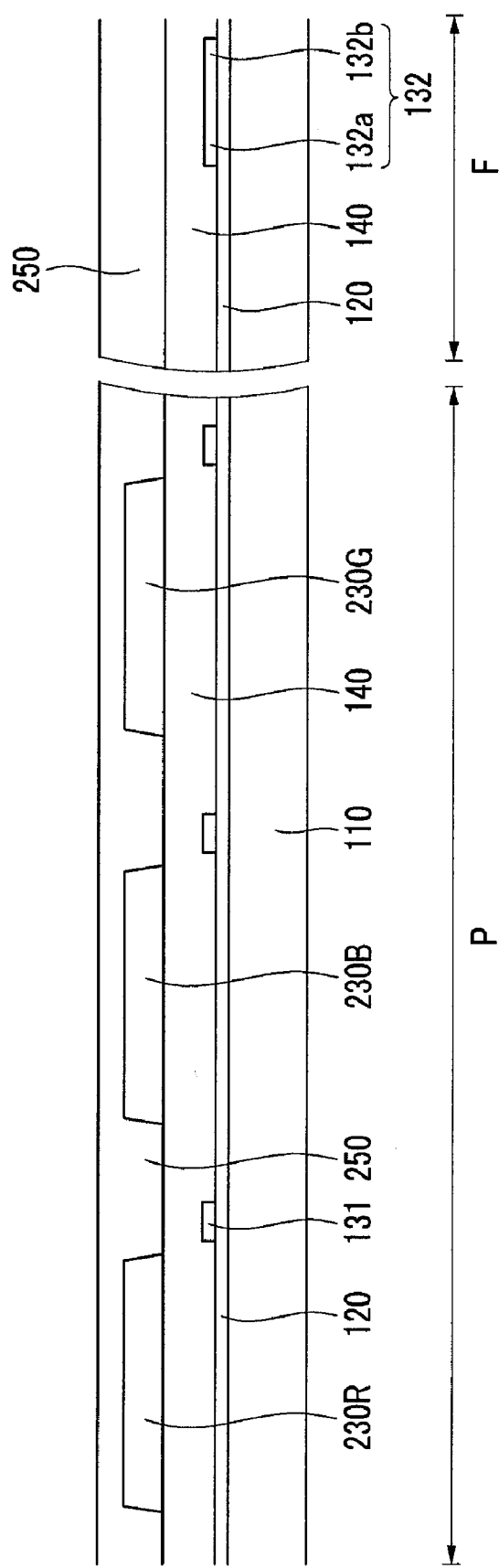
FIG. 4 to FIG. 7 are cross-sectional views showing an organic light emitting device in intermediate steps in a manufacturing process of an organic light emitting device according to an embodiment of the present invention.

Firstly, as shown in FIG. 4, an interlayer insulating layer 120 made of an inorganic material is formed on an insulation substrate 110, a plurality of switching elements 131 including thin film transistors Qs and driving thin film transistors Qd are formed on the interlayer insulating layer 120 of the pixel area, and peripheral signal lines 132 are formed on the interlayer insulating layer 120 of the peripheral area. The peripheral signal line 132 includes a fan-out portion 132a, and a pad portion 132b that is an end portion of the fan-out portion 132a. Here, the forming of the switching elements 131 includes depositing a conductive layer, an insulating layer, and a semiconductor layer, and patterning them. Next, a passivation layer 140 made of an inorganic material such as silicon nitride or silicon oxide is formed on the switching element 131 of the pixel area, and the peripheral signal lines 132 of the peripheral area F. Next, a plurality of color filters 230R, 230G, and 230B are formed on the passivation layer 140 of the pixel area P. Next, an overcoat 250 is formed on the passivation layer 140, and the color filters 230R, 230G, and 230B.

Figure 5:
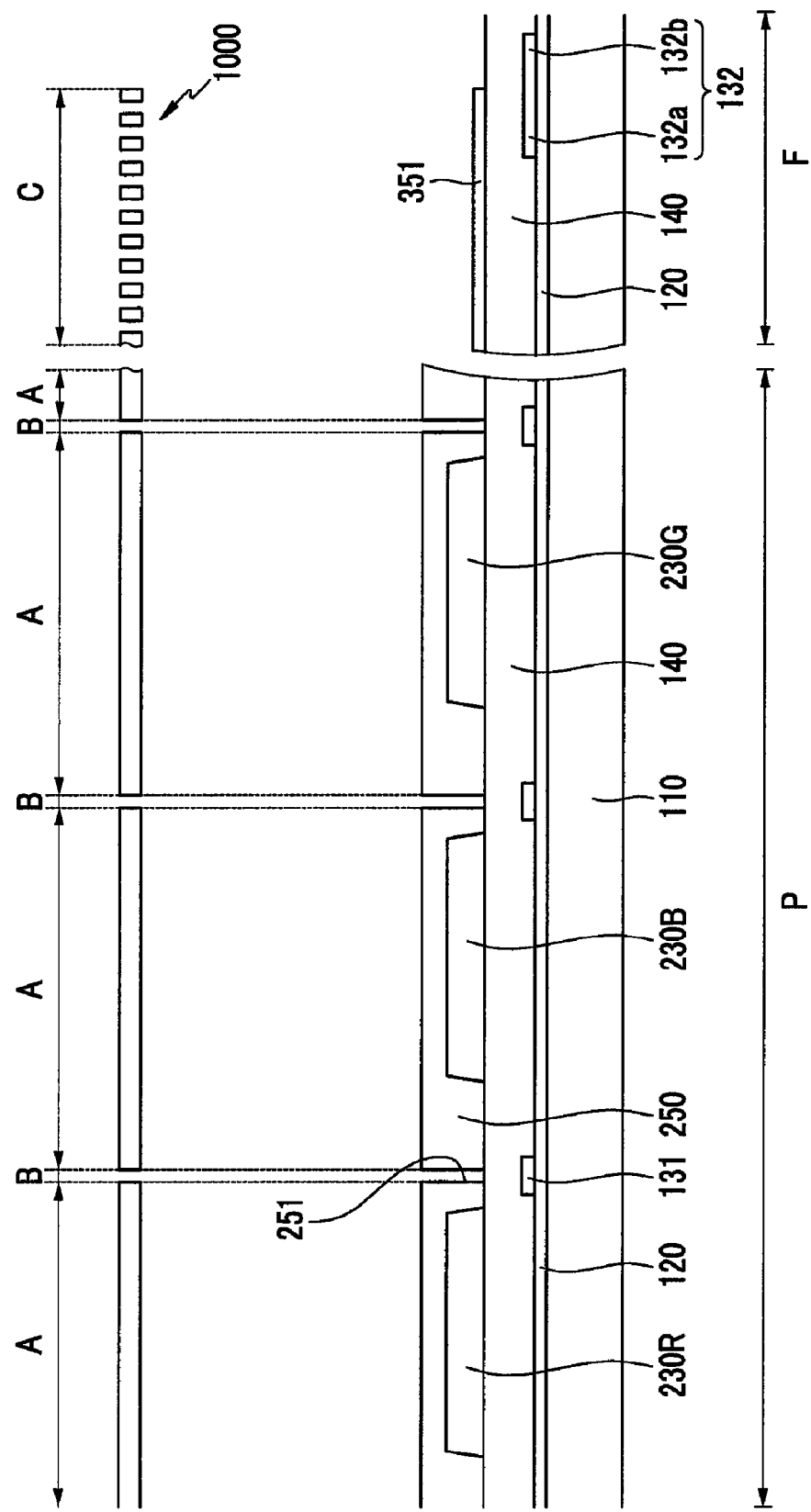

Next, as shown in FIG. 5, the overcoat 250 is patterned through a photolithography process using a light mask 1000 including a light blocking portion A, a light transmitting portion B, and a slit portion C. The overcoat 250 at the position of the light transmitting portion B is fully exposed and etched thereby forming the first contact hole 251, and the overcoat 250 corresponding to the slit portion C is partially exposed and etched thereby forming the remaining layer 351 having the thickness of approximately 7000 to 10,000 Å. The thickness of the remaining layer 351 is less than that of the overcoat 250. Here, the remaining layer 351 is formed on the position corresponding to the fan-out portion 132a of the peripheral signal line 132, and is not present on the position corresponding to the pad portion 132b of the peripheral signal line 132.

Figure 6:
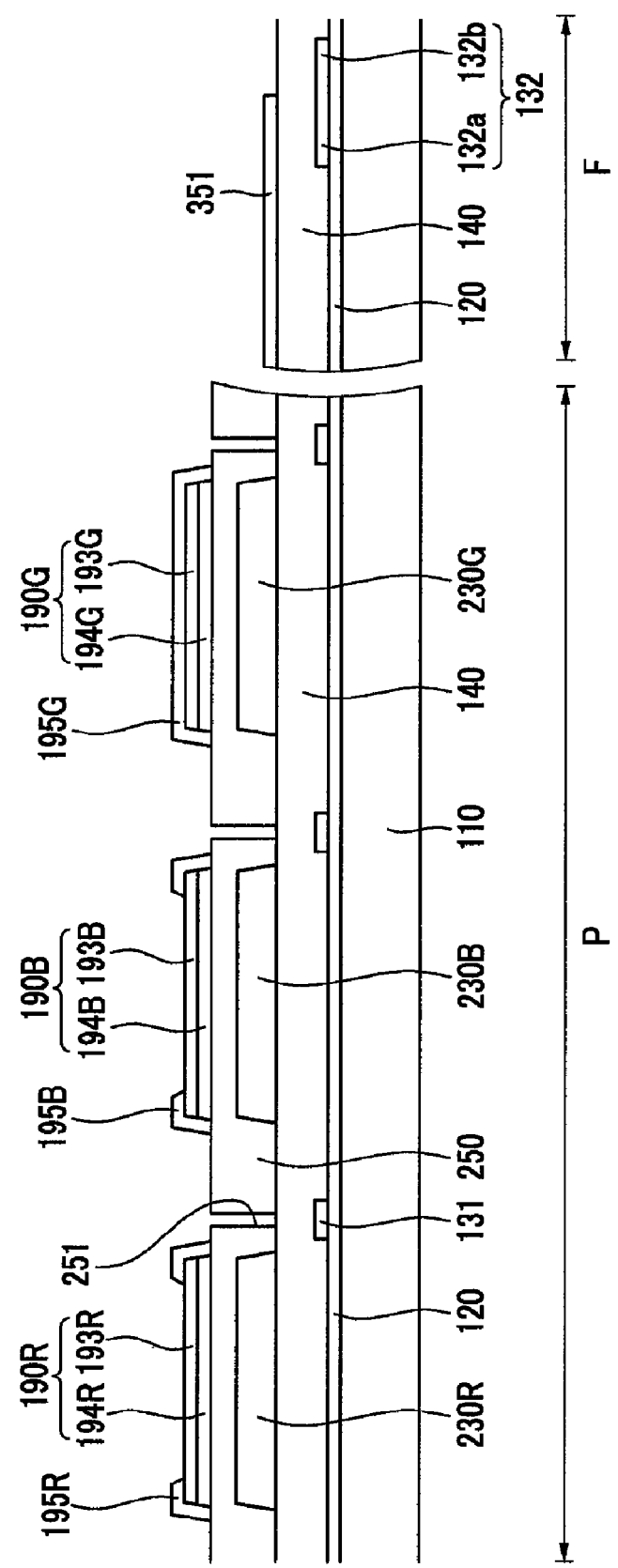

Next, as shown in FIG. 6, a transparent conductive layer such as ITO or IZO and an inorganic material such as silicon nitride are sequentially deposited on the overcoat 250 and patterned by photolithography to form transflective members 190R, 190G, and 190B on the positions corresponding to the color filters 230R, 230G, and 230B. Next, a transparent conductive layer such as ITO or IZO is deposited on the transflective members 190R, 190G, and 190B and the overcoat 250, and is patterned by photolithography to form thickness control layers 195R, 195G, and 195B. The red thickness control layer 195R and the blue thickness control layer 195B are patterned for the surface of the transflective members 190R and 190B to be exposed.

The remaining layer 351 is maintained in the peripheral area such that the etchant for etching the transparent conductive layer does not penetrate into the peripheral signal lines 132 during the two etch processes of the transparent conductive layer such that the peripheral signal lines 132 are not corroded.

Figure 7:
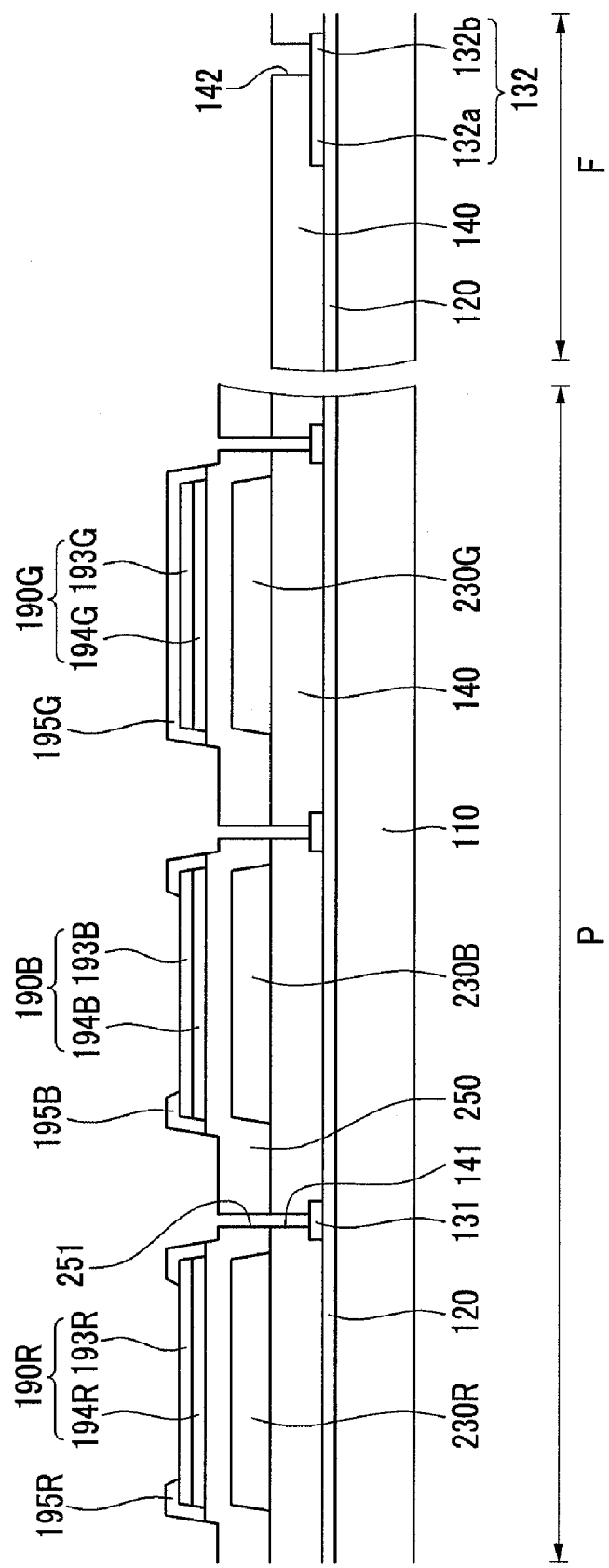

Next, as shown in FIG. 7, the passivation layer 140 exposed through the first contact hole 251 is etched to form the second contact hole 141 in the passivation layer 140 such that a portion of the switching element 131 is exposed. The remaining layer 351 is maintained on the position corresponding to the fan-out portion 132a of the peripheral area F such that the passivation layer 140 of the fan-out portion 132a is not etched, and the passivation layer 140 of the pad portion 132b is etched to thereby form a pad contact hole 142. The pad contact hole 142 exposes the pad portion 132b.

Next, the remaining layer 351 is etched through an ashing process, in one example and is removed. Here, the portion of the surface of the overcoat 250 that is not covered by the thickness control layers 195R, 195G, and 195B and the transflective members 190R, 190G, and 190B and is exposed in the pixel area is removed. The region where the portion of the surface of the overcoat 250 is removed corresponds to the region between the transflective members 190R, 190G, and 190B.

Next, as shown in FIG. 3, pixel electrodes 191R, 191G, and 191B are formed on the transflective members 190R, 190G, and 190B, and the thickness control layers 195R, 195G, and 195B of the pixel area, and a contact assistant 199 contacting the pad portion 132b is formed on the pad contact hole 142.

Next, an insulating layer is coated on the pixel electrodes 191R, 191B, and 191G and the overcoat 250, and is patterned to form a plurality of insulating members 361 between the pixel electrodes 191R, 191G, and 191B. Next, an organic light emitting member 370 including a red emission layer (not shown), a blue emission layer (not shown), and a green emission layer (not shown) that are deposited sequentially is formed on the substrate. The red emission layer, the blue emission layer, and the green emission layer may be repeatedly deposited two or more times. Next, the common electrode 270 is formed on the organic light emitting member 370.

While this invention has been described in connection with what is presently considered to be practical embodiments, it is to be understood that the invention is not limited to the disclosed embodiments, but, is intended to cover various modifications and equivalent arrangements included within the spirit and scope of the appended claims.

What is claimed is:

1. A method for manufacturing an organic light emitting device including a pixel area displaying images and a peripheral area that is a peripheral portion of the pixel area, comprising:
    forming a switching element of the pixel area;
    forming a peripheral signal line in the peripheral area;
    forming a passivation layer on the switching element and the peripheral signal line;
    forming an overcoat and a remaining layer on the passivation layer, the remaining layer covering a portion of the peripheral signal line;
    forming a transflective member and a thickness control layer on the overcoat;
    removing the remaining layer;
    forming a pixel electrode on the transflective member and the thickness control layer;
    forming an organic light emitting member on the pixel electrode; and
    forming a common electrode on the organic light emitting member.

2. The method of claim 1, wherein
the overcoat is formed in the pixel area, and the remaining layer is formed with a lesser thickness than the overcoat in the peripheral area.

3. The method of claim 2, wherein
the remaining layer is formed through partial exposure.

4. The method of claim 3, wherein
the peripheral signal line includes a fan-out portion and a pad portion that is an end of the fan-out portion, and the remaining layer is formed in the peripheral area corresponding to the fan-out portion.

5. The method of claim 3, wherein
a first contact hole is simultaneously formed in the overcoat when forming the remaining layer.

6. The method of claim 5, wherein
a second contact hole exposing the switching element in the passivation layer at a position corresponding to the first contact hole is formed between the forming of the thickness control layer and the removing of the remaining layer.

7. The method of claim 6, wherein
the thickness of the portion among the overcoat disposed on the region between the transflective members is reduced in the removing of the remaining layer.

* * * * *